US007921804B2

(12) United States Patent
Lee

(10) Patent No.: US 7,921,804 B2
(45) Date of Patent: Apr. 12, 2011

(54) PLASMA GENERATING NOZZLE HAVING IMPEDANCE CONTROL MECHANISM

(75) Inventor: Sang Hun Lee, San Ramon, CA (US)

(73) Assignees: Amarante Technologies, Inc., Santa Clara, CA (US); Saian Corporation, Wakayama (JP)

( * ) Notice: Subject to any disclaimer, the term of this patent is extended or adjusted under 35 U.S.C. 154(b) by 206 days.

(21) Appl. No.: 12/315,913

(22) Filed: Dec. 8, 2008

(65) Prior Publication Data

US 2010/0140509 A1 Jun. 10, 2010

(51) Int. Cl.
*C23C 16/00* (2006.01)
*B23K 9/02* (2006.01)

(52) U.S. Cl. ..... 118/723 MW; 118/723 DC; 219/121.5; 219/121.36

(58) Field of Classification Search ............... 250/493.1, 250/423 R, 424; 219/121.36, 121.5, 121.51, 219/121.52, 121.54, 121.55, 121.57; 118/723 MW, 118/723 ME, 723 DC
See application file for complete search history.

(56) References Cited

U.S. PATENT DOCUMENTS 3,353,060 A * 11/1967 Yamamoto et al. ...... 315/111.31
3,911,318 A * 10/1975 Spero et al. ..................... 315/39
4,151,034 A 4/1979 Yamamoto et al.
4,185,213 A * 1/1980 Scannell ......................... 310/11
4,609,808 A 9/1986 Bloyet et al.
4,611,108 A 9/1986 Leprince et al.
4,652,723 A 3/1987 Salinier et al.
4,711,627 A 12/1987 Oeschsle et al.
5,083,004 A * 1/1992 Wells et al. ................ 219/121.5
5,114,770 A 5/1992 Echizen et al.
5,349,154 A * 9/1994 Harker et al. ................. 117/102
5,565,118 A 10/1996 Asquith
5,645,796 A 7/1997 Caputo et al.
5,679,167 A 10/1997 Muehlberger
5,689,949 A * 11/1997 DeFreitas et al. ............... 60/776
5,793,013 A * 8/1998 Read et al. ............... 219/121.48
5,972,302 A 10/1999 Tranquilla et al.
5,994,663 A 11/1999 Lu
6,039,834 A 3/2000 Tanaka et al.
6,125,859 A 10/2000 Kao et al.
6,157,867 A 12/2000 Hwang et al.
6,230,060 B1 5/2001 Mawhinney
6,262,386 B1 7/2001 Foernsel
6,388,225 B1 5/2002 Blum et al.
6,417,013 B1 7/2002 Teixeira et al.
6,439,155 B1 * 8/2002 Kamarehi et al. ..... 118/723 ME
(Continued)

FOREIGN PATENT DOCUMENTS

CN 2704179 6/2005
(Continued)

*Primary Examiner* — Bernard E Souw
(74) *Attorney, Agent, or Firm* — Jordan and Hamburg LLP

(57) ABSTRACT

The present invention provides a plasma generating system that includes: a microwave generator for generating microwave energy; a power supply connected to the microwave generator for providing power thereto; a microwave cavity; a waveguide operatively connected to the microwave cavity for transmitting microwave energy thereto; an isolator for dissipating microwave energy reflected from the microwave cavity; and at least one nozzle coupled to the microwave cavity. The nozzle includes: a housing having a generally cylindrical space formed therein, the space forming a gas flow passageway; a rod-shaped conductor disposed in the space and operative to transmit microwave energy along a surface thereof so that the microwave energy excites gas flowing through the space; and an impedance controlling structure which adjusts the impedance of the nozzle.

20 Claims, 3 Drawing Sheets

U.S. PATENT DOCUMENTS

| | | | | |
|---|---|---|---|---|
| 6,525,481 | B1 | 2/2003 | Kilma et al. | |
| 6,673,200 | B1 | 1/2004 | Gu et al. | |
| 6,734,385 | B1 | 5/2004 | Bark et al. | |
| 7,164,095 | B2 * | 1/2007 | Lee et al. | 219/121.5 |
| 7,338,575 | B2 | 3/2008 | Pingree, Jr. et al. | |
| 7,554,054 | B2 * | 6/2009 | Takada et al. | 219/121.43 |
| 2001/0024114 | A1 | 9/2001 | Kitagawa et al. | |
| 2002/0020691 | A1 | 2/2002 | Jewett et al. | |
| 2002/0050323 | A1 | 5/2002 | Moisan et al. | |
| 2003/0000823 | A1 | 1/2003 | Uhm et al. | |
| 2003/0032207 | A1 | 2/2003 | Rengarajan et al. | |
| 2003/0085000 | A1 | 5/2003 | Horioka et al. | |
| 2003/0178140 | A1 | 9/2003 | Hanazaki et al. | |
| 2003/0199108 | A1 | 10/2003 | Tanaka et al. | |
| 2004/0007326 | A1 | 1/2004 | Roche et al. | |
| 2004/0016402 | A1 | 1/2004 | Walther et al. | |
| 2004/0079287 | A1 | 4/2004 | Smith et al. | |
| 2004/0083797 | A1 | 5/2004 | Ward et al. | |
| 2004/0173583 | A1 | 9/2004 | Iriyama et al. | |
| 2004/0262268 | A1 * | 12/2004 | Wu | 219/121.36 |
| 2006/0006153 | A1 | 1/2006 | Lee et al. | |
| 2006/0021581 | A1 | 2/2006 | Lee et al. | |
| 2006/0021980 | A1 | 2/2006 | Lee et al. | |
| 2006/0042546 | A1 | 3/2006 | Ishii et al. | |
| 2006/0057016 | A1 | 3/2006 | Kumar et al. | |
| 2007/0221634 | A1 | 9/2007 | Condick | |
| 2008/0017616 | A1 | 1/2008 | Lee et al. | |
| 2008/0029030 | A1 | 2/2008 | Goto et al. | |
| 2008/0073202 | A1 | 3/2008 | Lee et al. | |
| 2008/0093358 | A1 | 4/2008 | Lee et al. | |
| 2010/0201272 | A1 * | 8/2010 | Lee | 315/111.21 |

FOREIGN PATENT DOCUMENTS

| | | |
|---|---|---|
| CN | 101137267 | 3/2008 |
| EP | 0 397 468 | 11/1990 |
| JP | 60-046029 | 3/1985 |
| JP | 60-502243 | 12/1985 |
| JP | 62-81274 | 4/1987 |
| JP | 62-228482 | 10/1987 |
| JP | 3-075318 | 3/1991 |
| JP | 5-146879 | 6/1993 |
| JP | 6-013329 | 1/1994 |
| JP | 6-244140 | 9/1994 |
| JP | 7-135196 | 5/1995 |
| JP | 7-258828 | 10/1995 |
| JP | 9-169595 | 6/1997 |
| JP | 10-284296 | 10/1998 |
| JP | 2001-044177 | 2/2001 |
| JP | 2001-502110 | 2/2001 |
| JP | 2001-068298 | 3/2001 |
| JP | 2002-124398 | 4/2002 |
| JP | 2003-033862 | 2/2003 |
| JP | 2003-059917 | 2/2003 |
| JP | 2003-086580 | 3/2003 |
| JP | 2003-133302 | 5/2003 |
| JP | 2003-167017 | 6/2003 |
| JP | 2003-171785 | 6/2003 |
| JP | 2003-197397 | 7/2003 |
| JP | 2003-213414 | 7/2003 |
| JP | 2004-006211 | 1/2004 |
| JP | 2004-237321 | 8/2004 |
| JP | 2004-285187 | 10/2004 |
| JP | 2005-002355 | 1/2005 |
| JP | 2005-095744 | 4/2005 |
| JP | 2005-116217 | 4/2005 |
| JP | 2005-235464 | 9/2005 |
| JP | 2005-534187 | 11/2005 |
| JP | 2006-121073 | 5/2006 |
| JP | 2007-530955 | 11/2007 |
| JP | 2008-508683 | 3/2008 |
| KR | 2006-0001944 | 1/2006 |
| WO | WO-2004-017046 | 1/2004 |
| WO | WO-2005/096681 | 10/2005 |
| WO | WO-2006/014862 | 2/2006 |

* cited by examiner

PLASMA GENERATING NOZZLE HAVING IMPEDANCE CONTROL MECHANISM

BACKGROUND OF THE INVENTION

1. Field of the Invention

The present invention relates to plasma generators, and more particularly to devices having a nozzle that discharges a plasma plume.

2. Discussion of the Related Art

In recent years, the progress on producing plasma by use of microwave energy has been increasing. Typically, a plasma producing system includes a device for generating microwave energy and a nozzle that receives the microwave energy to excite gas flowing through the nozzle into plasma. One of the difficulties in operating a conventional plasma producing system is providing an optimum condition for plasma ignition—a transition from the gas into the plasma. Several parameters, such as gas pressure, gas composition, nozzle geometry, nozzle impedance, material properties of nozzle components, intensity of microwave energy applied to the nozzle, and distance between the nozzle exit and the portion in the nozzle where the microwave energy is focused, for instance, may affect the plasma ignition condition. The threshold intensity of the microwave energy for plasma ignition can be reduced if the nozzle impedance can be adjusted to its optimum value so that the amount of microwave energy received by the nozzle can be maximized. Thus, there is a need for a nozzle that has a mechanism for adjusting the nozzle impedance.

SUMMARY OF THE INVENTION

According to one aspect of the present invention, a plasma generating system includes at least one nozzle. The nozzle includes: a housing having a generally cylindrical space formed therein, the space forming a gas flow passageway; a rod-shaped conductor disposed in the space and operative to transmit microwave energy along a surface thereof so that the microwave energy excites gas flowing through the space; and an impedance controlling structure configured to vary an impedance of the nozzle.

According to another aspect of the present invention, a plasma generating system includes: a microwave generator for generating microwave energy; a power supply connected to the microwave generator for providing power thereto; a microwave cavity; a waveguide operatively connected to the microwave cavity for transmitting microwave energy thereto; an isolator for dissipating microwave energy reflected from the microwave cavity; and at least one nozzle coupled to the microwave cavity. The nozzle includes: a housing having a generally cylindrical space formed therein, the space forming a gas flow passageway; a rod-shaped conductor disposed in the space and operative to transmit microwave energy along a surface thereof so that the microwave energy excites gas flowing through the space; and an impedance controlling structure configure to vary the impedance of the nozzle.

The above, and other objects, features and advantages of the present invention will become apparent from the following description read in conjunction with the accompanying drawings, in which like reference numerals designate the same elements. The present invention is considered to include all functional combinations of the above described features and is not limited to the particular structural embodiments shown in the figures as examples. The scope and spirit of the present invention is considered to include modifications as may be made by those skilled in the art having the benefit of the present disclosure which substitute, for elements or processes presented in the claims, devices or structures or processes upon which the claim language reads or which are equivalent thereto, and which produce substantially the same results associated with those corresponding examples identified in this disclosure for purposes of the operation of this invention. Additionally, the scope and spirit of the present invention is intended to be defined by the scope of the claim language itself and equivalents thereto without incorporation of structural or functional limitations discussed in the specification which are not referred to in the claim language itself. Still further it is understood that recitation of the preface of "a" or "an" before an element of a claim does not limit the claim to a singular presence of the element and the recitation may include a plurality of the element unless the claim is expressly limited otherwise. Yet further it will be understood that recitations in the claims which do not include "means for" or "steps for" language are not to be considered limited to equivalents of specific embodiments described herein.

DETAILED DESCRIPTION OF THE PREFERRED EMBODIMENTS

Figure 1:
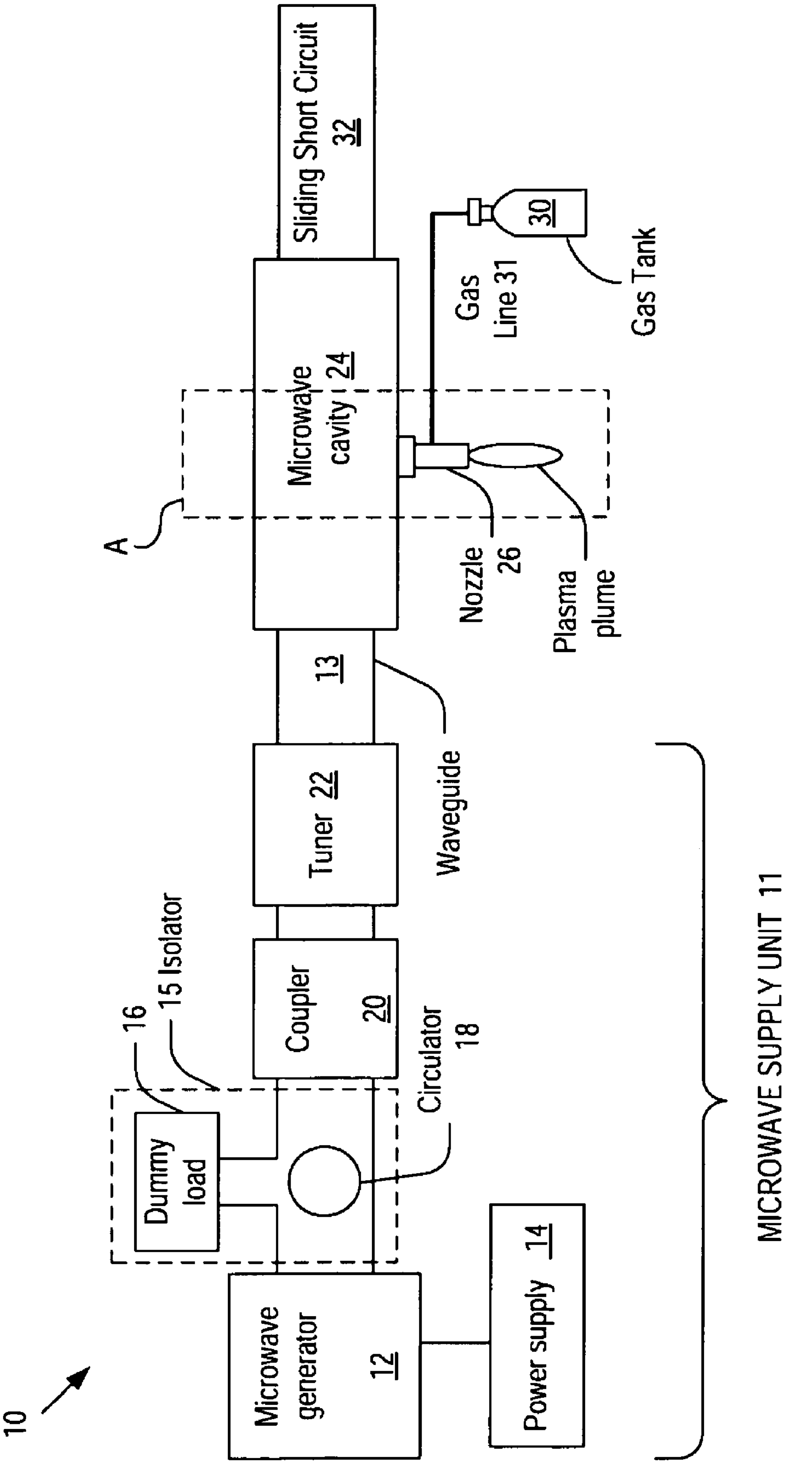
FIG. 1 shows a schematic diagram of a plasma generating system in accordance with one embodiment of the present invention.

FIG. 1 shows a schematic diagram of a plasma generating system 10 in accordance with one embodiment of the present invention. As illustrated, the system 10 includes: a microwave cavity/waveguide 24; a microwave supply unit 11 for providing microwave energy to the microwave cavity 24 via a microwave waveguide 13; a nozzle 26 connected to the microwave cavity 24 and operative to receive microwave energy from the microwave cavity 24 and excite gas by use of the received microwave energy; and a sliding short circuit 32 disposed at the end of the microwave cavity 24. The gas stored in a gas tank 30 is provided to the nozzle 26 via a gas line 31 connected to the nozzle.

The microwave supply unit 11 provides microwave energy to the microwave cavity 24 and includes: a microwave generator 12 for generating microwaves; a power supply 14 for supplying power to the microwave generator 12; and an isolator 15 having a dummy load 16 for dissipating reflected microwave energy that propagates toward the microwave generator 12 and a circulator 18 for directing the reflected microwave energy to the dummy load 16.

The microwave supply unit 11 may further include a coupler 20 for measuring fluxes of the microwave energy, and a tuner 22 for reducing the microwave energy reflected from the sliding short circuit 32. The components of the microwave supply unit 11 shown in FIG. 1 are listed herein for exemplary purposes only. Also, it is possible to replace the microwave supply unit 11 with any other suitable system having the capability to provide microwave energy to the microwave cavity 24 without deviating from the spirit and scope of the present invention. Likewise, the sliding short circuit 32 may be replaced by a phase shifter that can be configured in the microwave supply unit 11. Typically, a phase shifter is mounted between the isolator 15 and the coupler 20.

Figure 3:
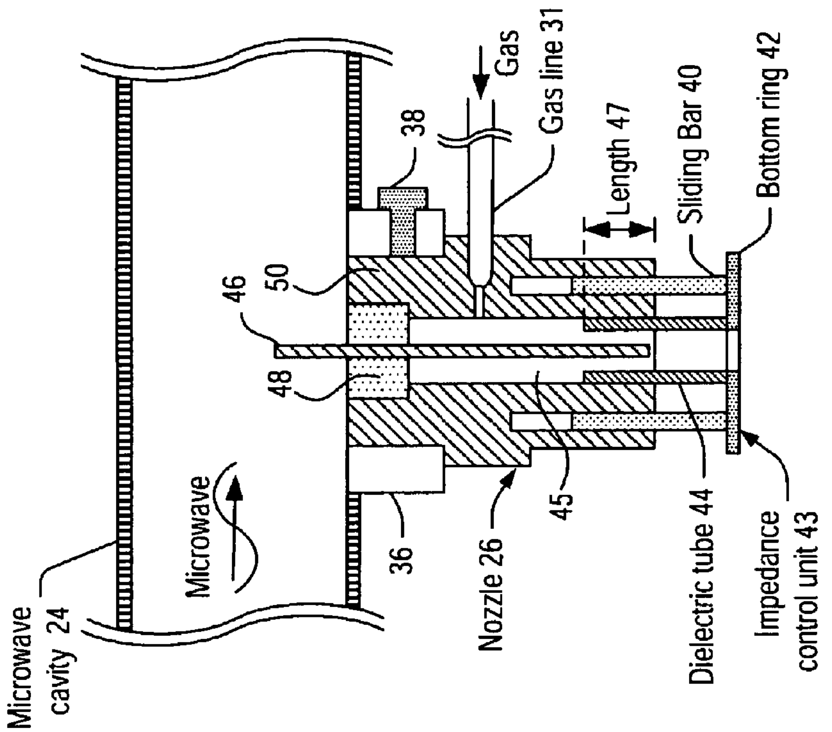
FIG. 3 shows a side cross-sectional view of the portion of the plasma generating system of FIG. 2, taken along the line III-III.
Figure 2:
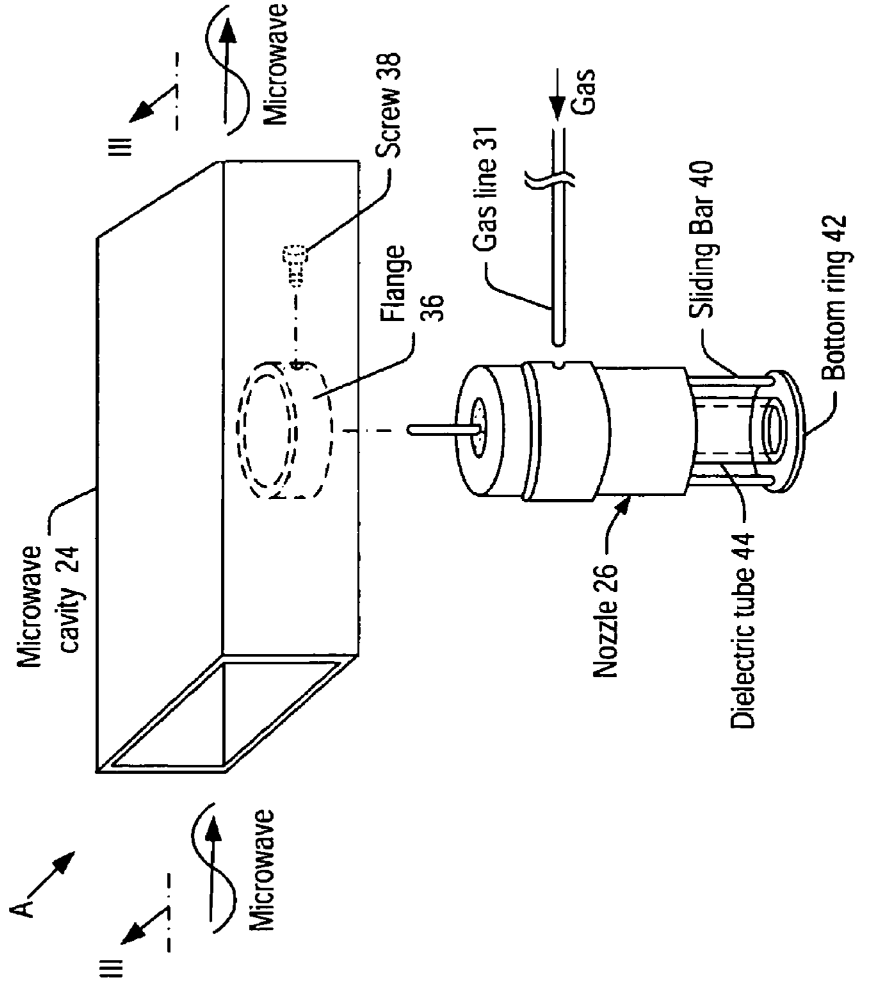
FIG. 2 shows an exploded view of a portion of the plasma generating system of FIG. 1.

FIG. 2 shows an exploded view of a portion A of the plasma generating system 10 of FIG. 1. FIG. 3 shows a side cross-sectional view of the portion A of the plasma generating system 10, taken along the line III-III. As depicted, a ring-shaped flange 36 is affixed to a bottom surface of the microwave cavity 24 and the nozzle 26 is secured to the ring-shaped flange 36 by one or more suitable fasteners 38, such as screws.

The nozzle 26 includes a rod-shaped conductor 46; a housing or shield 50 formed of conducting material, such as metal, and having a generally cylindrical cavity/space 45 formed therein so that the space forms a gas flow passageway; an electrical insulator 48 disposed in the space and adapted to hold the rod-shaped conductor 46 relative to the shield 50; and an impedance control unit 43. The impedance control unit 43 includes a bottom ring 42; one or more sliding bars 40 secured to the bottom ring 42; and a dielectric tube 44 secured to the bottom ring 42. In a preferred embodiment the dielectric tube 44 is made of quartz. However, the present invention is not limited to such and one skilled in the art will realize other dielectric materials may be used and such use is considered within the scope and spirit of the present invention. Furthermore, the bottom ring 42 and sliding bars 40 are an exemplary embodiment of a movable mount structure which is optionally used to mount the dielectric tube 44 in a movable manner relative to the shield 50. The scope and spirit of the present invention includes other embodiments of a movable mount structure which may be realized by those of ordinary skill in the art in view of this disclosure to mount the dielectric tube 44 movable relative to the shield 50.

The top portion (or, equivalently, proximal end portion) of the rod-shaped conductor 46 functions as an antenna to pick up microwave energy in the microwave cavity 24. The microwave energy captured by the rod-shaped conductor 46 flows along the surface thereof. The gas supplied via a gas line 31 is injected into the space 45 and excited by the microwave energy flowing through the rod-shaped conductor 46 into plasma.

The dielectric tube 44 is slidably mounted in the space 45. As the sliding bars 40 slide along elongated holes formed in the housing 50, the dielectric tube 44 slides along an inner surface of the housing 50. The cross-sectional dimension of the sliding bars is small enough to allow the bars to slide along the elongated holes, yet large enough to make the impedance control unit 43 remain in position after the position of the impedance control unit 43 relative to the housing 50 is adjusted by a human operator or a suitable adjusting mechanism. As the impedance control unit 43 is moved relative to the housing 50, a length 47 of the portion of the dielectric tube 44 within the space 45 changes to thereby vary the nozzle impedance.

Figure 4:
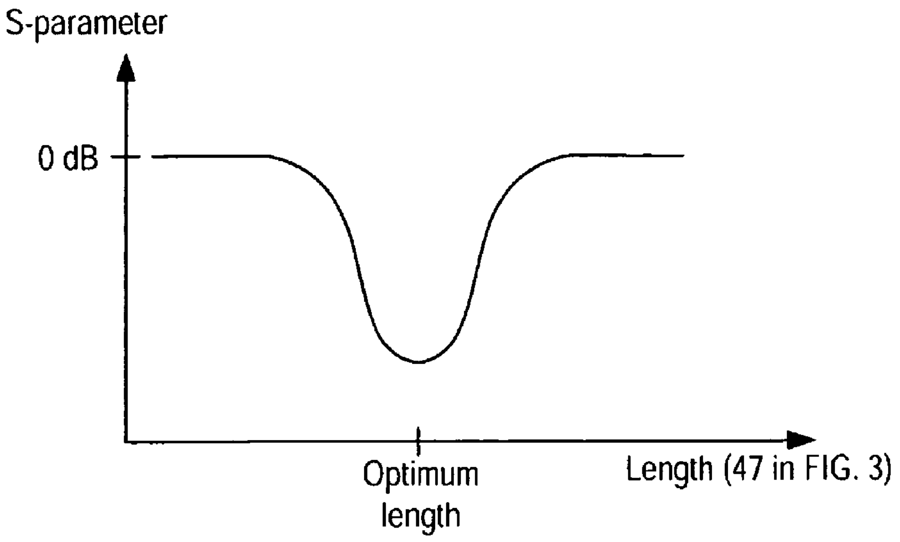
FIG. 4 shows a plot of S-parameter as a function of a length of a portion of a dielectric tube disposed in the housing of the nozzle in FIG. 3.

The nozzle impedance may affect the threshold intensity of the microwave energy in the microwave cavity 24 for plasma ignition. FIG. 4 is a plot of S-parameter as a function of the length 47, where the S-parameter is defined as a ratio of microwave energy intensity between two points, one downstream of the nozzle and the other upstream of the nozzle along an axial direction of the microwave cavity 24. As depicted, the value of the S-parameter approaches substantially one, i.e., the amount of microwave energy delivered to the nozzle becomes insignificant as the length 47 deviates away from the optimum value. However, as the length 47 approaches the optimum value, the S-parameter approaches its minimum value, which indicates that the microwave energy delivered to the nozzle 26 approaches its maximum. During ignition, the impedance control unit 43 is moved relative to the housing 50 so that the length 47 is at or near the optimum value.

Upon ignition, a plasma plume is generated at the lower tip of the rod-shaped conductor 46 and extends through the dielectric tube 44 so that the plasma exits the hole formed in the central portion of the bottom ring 42. The plasma plume may affect the nozzle impedance, which typically requires re-adjustment of the length 47. Thus, once the plasma plume is established, the length 47 is tuned so that the nozzle impedance is adjusted to its optimum value for operation.

Figure 5:
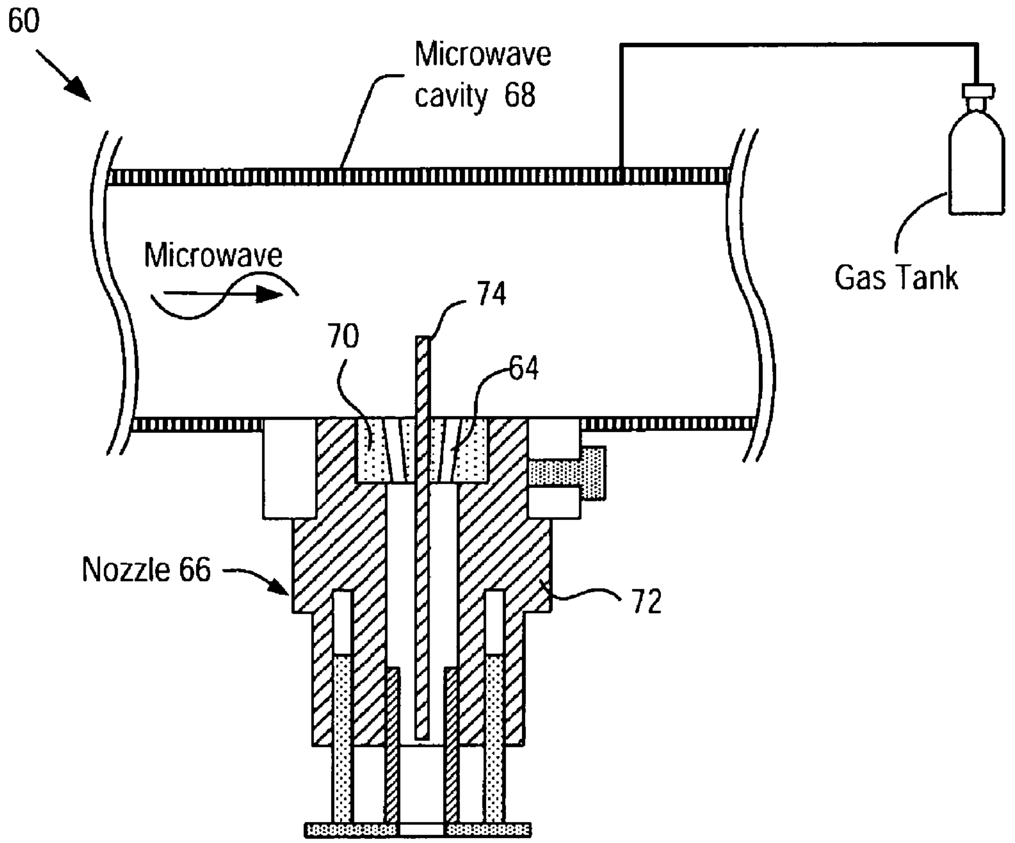
FIG. 5 shows a side cross-sectional view of a portion of a plasma generating system in accordance with another embodiment of the present invention.

FIG. 5 shows a side cross-sectional view of a portion of a plasma generating system 60 in accordance with another embodiment of the present invention. As depicted, the system 60 is similar to the system 10 of FIG. 3, with a difference being in the gas injection system as described herein. As depicted, the gas is supplied through a waveguide 68 and through holes 64 formed in an electrical insulator 70, i.e., a housing/insulator 72 of the nozzle 66 does not have a gas injection hole. The through holes 64 may be angled relative to a longitudinal axis of a rod-shaped conductor 74 to impart a helical shaped flow direction around the rod-shaped conductor to a gas passing along the through holes 64.

It is noted that the plasma generating systems depicted with reference to FIGS. 1-5 have only one nozzle. However, it should be apparent to those of ordinary skill that more than one nozzle can be used in each system. Detailed descriptions of systems having multiple nozzles and methods for operating the systems can be found in U.S. Pat. No. 7,164,095 and U.S. Patent Publication Serial Nos. 2006/0021581, 2006/0021980, 2008/0017616 and 2008/0073202, which are herein incorporated by reference in their entirety.

It is also noted that the position of the rod-shaped conductor 46 (or 74) relative to the housing 50 (or 72) affects the nozzle impedance. As such, the nozzle 26 (or 66) may have a mechanism to move the rod-shaped conductor relative to the housing so that the nozzle impedance can be optimized during ignition and operation of the nozzle. The present invention thus further includes the movable dielectric tube 44 used in conjunction with a mechanism to move the rod-shape conductor 46 relative to the housing. More detailed information of the mechanism to move the rod-shaped conductor 46 can be found in U.S. patent application entitled "Plasma generating system having tunable plasma nozzle," filed on Nov. 12, 2008 by inventor Sang Hun Lee, which is herein incorporated by reference in its entirety. As described therein, a micrometer can be used as a mechanism to move a rod-shaped conductor relative to a housing. This application further incorporates by reference herein in its entirety application Ser. No. 12/284,570, filed on Sep. 23, 2008 entitled "Plasma generating system."

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims. Such modifications include substitution of components for components specifically identified herein, wherein the substitute component provides functional results which permit the overall functional operation of the present invention to be maintained. Such substitutions are intended to encompass presently known components and components yet to be developed which are accepted as replacements for components identified herein and which produce results compatible with operation of the present invention. Furthermore, while examples have been provided illustrating operation at certain frequencies, the present invention as defined in this disclosure and claims appended hereto is not considered limited to frequencies recited herein.

What is claimed is:

1. A plasma generating system comprising at least one nozzle, each one of said at least one nozzle comprising:

a housing having a substantially cylindrical space formed therein, the space forming a gas flow passageway;

a rod-shaped conductor disposed in the space and operative to transmit microwave energy along a surface thereof so that the microwave energy excites gas flowing through the space; and an impedance controlling structure configured to vary an impedance of the nozzle, the impedance controlling structure comprising a first portion located within the gas passageway, said first portion being distinct from the rod-shaped conductor and;

said each one nozzle having an opening through which is emitted a plasma plume.

2. A plasma generating system as recited in claim 1, wherein the impedance controlling structure is configured to vary nozzle impedance by varying length of the gas flow passageway.

3. A plasma generating system as recited in claim 2, wherein the impedance controlling structure includes a dielectric tube slidably mounted such that at least a portion of said dielectric tube is slidably disposed inside the space of the housing and movable relative to the housing to vary length of the gas flow passageway.

4. A plasma generating system as recited in claim 3, wherein the housing defines at least one opening, and wherein the impedance controlling structure includes a movable mount structure slidably mounting the dielectric tube, the movable mount structure including:

a bottom ring secured to the dielectric tube; and at least one sliding bar secured to the bottom ring and adapted to slide along a first opening of said at least one opening;

wherein the dielectric tube moves relative to the housing as the sliding bar slides along the first opening.

5. A plasma generating system as recited in claim 1, wherein the housing includes a gas inlet hole.

6. A plasma generating system as recited in claim 1, wherein the housing is secured to a surface of a microwave cavity and a portion of the rod-shaped conductor extends into the microwave cavity to receive microwave energy.

7. A plasma generating system as recited in claim 6, further comprising an electrical insulator disposed in the space and adapted to hold the rod-shaped conductor relative to the housing.

8. A plasma generating system as recited in claim 7, wherein the electrical insulator includes at least one through hole angled with respect to a longitudinal axis of the rod-shaped conductor for imparting a helical shaped flow direction around the rod-shaped conductor to a gas passing through the through hole.

9. A plasma generating system as recited in claim 1, wherein the impedance controlling structure includes the nozzle opening through which is emitted the plasma plume.

10. A plasma generating system, comprising:

a microwave generator for generating microwave energy;

a power supply connected to the microwave generator for providing power thereto;

a microwave cavity;

a waveguide operatively connected to the microwave cavity for transmitting microwave energy thereto;

an isolator for dissipating microwave energy reflected from the microwave cavity; and at least one nozzle coupled to the microwave cavity, each one of said at least one nozzle comprising:

a housing having a substantially cylindrical space formed therein, the space forming a first gas flow passageway;

a rod-shaped conductor disposed in the space and having a portion extending into the microwave cavity for receiving microwave energy and operative to transmit microwave energy along a surface thereof so that the microwave energy transmitted along the surface excites gas flowing through the space; and an impedance controlling structure configured to vary an impedance of the nozzle, the impedance controlling structure comprising a first portion located within the gas passageway, said first portion being distinct from the rod-shaped conductor and;

said each one nozzle having an opening through which is emitted a plasma plume.

11. A plasma generating system as recited in claim 10, wherein the impedance controlling structure is configured to vary nozzle impedance by varying length of the gas flow passageway.

12. A plasma generating system as recited in claim 11, wherein the impedance controlling structure includes a dielectric tube slidably mounted such that at least a portion of said dielectric tube is slidably disposed inside the space of the housing and movable relative to the housing to vary length of the first gas flow passageway.

13. A plasma generating system as recited in claim 12, wherein the housing defines at least one opening, and wherein the impedance controlling structure includes a movable mount structure slidably mounting the dielectric tube, the movable mount structure including:

a bottom ring secured to the dielectric tube; and at least one sliding bar secured to the bottom ring and adapted to slide along a first opening of said at least one opening;

wherein the dielectric tube moves relative to the housing as the sliding bar slides along the first opening.

14. A plasma generating system as recited in claim 10, wherein the housing includes a gas inlet hole.

15. A plasma generating system as recited in claim 10, further comprising an electrical insulator disposed in the space and adapted to hold the rod-shaped conductor relative to the housing.

16. A plasma generating system as recited in claim 15, wherein the microwave cavity includes a wall forming a portion of a second gas flow passageway.

17. A plasma generating system as recited in claim 16, wherein the electrical insulator includes at least one through hole angled with respect to a longitudinal axis of the rod-shaped conductor for imparting a helical shaped flow direction around the rod-shaped conductor to a gas passing along the through hole.

18. A plasma generating system as recited in claim 15, wherein the electrical insulator includes at least one through hole angled with respect to a longitudinal axis of the rod-shaped conductor for imparting a helical shaped flow direction around the rod-shaped conductor to a gas passing along the through hole.

19. A plasma generating system as recited in claim 10, wherein the microwave cavity includes a wall forming a portion of a second gas flow passageway.

20. A plasma generating system as recited in claim 10, wherein the impedance controlling structure includes the nozzle opening through which is emitted the plasma plume.

* * * * *